(12) United States Patent
Kim et al.

(10) Patent No.: US 7,501,224 B2
(45) Date of Patent: Mar. 10, 2009

(54) COMPOSITIONS FOR USE IN FORMING A PATTERN AND METHODS OF FORMING A PATTERN

(75) Inventors: Ju-Young Kim, Suwon-si (KR); Joon-Seok Oh, Seoul (KR); Jae-Hyun Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/025,823

(22) Filed: Feb. 5, 2008

(65) Prior Publication Data

US 2008/0193877 A1 Aug. 14, 2008

(30) Foreign Application Priority Data

Feb. 8, 2007 (KR) ...................... 10-2007-0013259

(51) Int. Cl.
*G03F 7/004* (2006.01)
*G03F 7/30* (2006.01)
*C08F 8/00* (2006.01)

(52) U.S. Cl. .................... 430/270.1; 430/323; 430/326; 430/909; 525/56; 525/61

(58) Field of Classification Search .............. 430/270.1, 430/323, 326, 909; 525/56, 61
See application file for complete search history.

(56) References Cited

U.S. PATENT DOCUMENTS

| | | | | |
|---|---|---|---|---|
| 6,555,617 B1 * | 4/2003 | Tanaka et al. | .................. | 525/61 |
| 6,737,474 B2 * | 5/2004 | Tanaka et al. | .................. | 525/61 |
| 2006/0188805 A1 | 8/2006 | Nozaki et al. | | |

FOREIGN PATENT DOCUMENTS

| | | |
|---|---|---|
| JP | 2004-046060 | 2/2004 |
| JP | 2004-191465 | 7/2004 |
| JP | 2006-106295 | 4/2006 |
| KR | 1020030043756 A | 6/2003 |
| KR | 1020060030002 A | 4/2006 |

* cited by examiner

*Primary Examiner*—John S Chu
(74) *Attorney, Agent, or Firm*—Volentine & Whitt, PLLC

(57) ABSTRACT

In a composition for forming an interfacial layer on a photoresist pattern, and a method of forming a pattern using the composition, the composition includes a water-soluble polymer, a cross-linking agent and a water-miscible solvent. The water-soluble polymer includes a repeating unit represented by Formula 1,

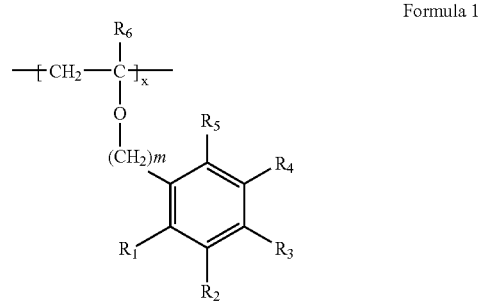

Formula 1 wherein $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ denotes a hydrogen atom or an alkyl group, m denotes an integer of 1 to 4 both inclusive, and x denotes an integer of 1 to 1,000 both inclusive. Also, at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

17 Claims, 4 Drawing Sheets

COMPOSITIONS FOR USE IN FORMING A PATTERN AND METHODS OF FORMING A PATTERN

CROSS-REFERENCE TO RELATED APPLICATION

A claim of priority under 35 U.S.C. §119 is made to Korean Patent Application No. 2007-13259, filed Feb. 8, 2007, in the Korean Intellectual Property Office (KIPO), the contents of which are herein incorporated by reference in their entirety.

BACKGROUND OF THE INVENTION

1. Field of the Invention

Example embodiments of the present invention relate to compositions for use in the formation of patterns and to methods of forming a pattern using the compositions.

2. Description of the Related Art

As design rules are decreased in order to increase the degree of integration of the semiconductor devices, it has become necessary to develop patterning methods which can reliably pattern layers at smaller and smaller dimensions. As examples, the wavelengths of light utilized in an exposure process have been shortened, and photoresist materials have been developed which are compatible with the shorter wavelength light sources and which exhibits relatively high resolutions. Nevertheless, the patterns formed by the use of a photoresist alone generally cannot exceed an exposure limit of the light source.

In an effort to further reduce the critical dimension of a pattern, research has been conducted in the formation of a chemically attached layer on a photoresist pattern. According to this technique, a fine pattern exceeding the exposure limit of the light source may be obtained. In addition, it may be possible to selectively form patterns having given physical profiles, such as linear shapes or rounded shapes.

Examples of the formation of a fine pattern utilizing a chemically attached layer on a photoresist pattern are disclosed in Korean Laid-Open Patent Publication No. 2003-0043756, Korean Laid-Open Patent Publication No. 2006-0030002 and U.S. Patent Application Publication No. 2006/0188805.

The composition employed in forming the chemically attached layer on a photoresist pattern includes components that do not dissolve the photoresist. In particular, the composition generally includes an aqueous solvent and a water-soluble polymer, and the water-soluble polymer may include a hydrophilic heteroatom. However, as the number of the heteroatoms included in the polymer increases, the etching resistance of the composition may be reduced.

SUMMARY OF THE INVENTION

According to one aspect of the present invention, a composition for use in the formation of a pattern includes a water-soluble polymer, a cross-linking agent and a water-miscible solvent. The water-soluble polymer includes a repeating unit represented by Formula 1:

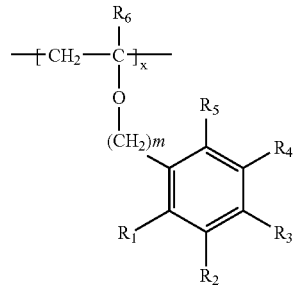

Formula 1 where, $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ denotes a hydrogen atom or an alkyl group, m denotes an integer of 1 to 4 both inclusive, and x denotes an integer of 1 to 1,000 both inclusive. Also, at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

In an example embodiment of the present invention, the water-soluble polymer may include a copolymer of a polymer having the repeating unit represented by Formula 1, and at least one polymer selected from the group consisting of poly(vinyl alcohol), poly(vinyl acetate), poly(vinyl acetal), poly(acrylic acid) and poly(methacrylic acid).

According to another aspect of the present invention, there is provided a method of forming a pattern on a substrate. In the method, a photoresist pattern is formed on the substrate, and then a water-soluble coating layer is formed on the photoresist pattern by coating the substrate with a composition including a water-soluble polymer, a cross-linking agent and a water-miscible solvent, where the water-soluble polymer includes including a repeating unit represented by Formula 1 above. A baking process is performed on the substrate to form an interfacial layer on the photoresist pattern.

BRIEF DESCRIPTION OF THE DRAWINGS

The above and other aspects and features of the present invention will become readily apparent from the detailed description that follows, with reference to the accompanying drawings, in which.

DESCRIPTION OF THE EMBODIMENTS

Figure 1:
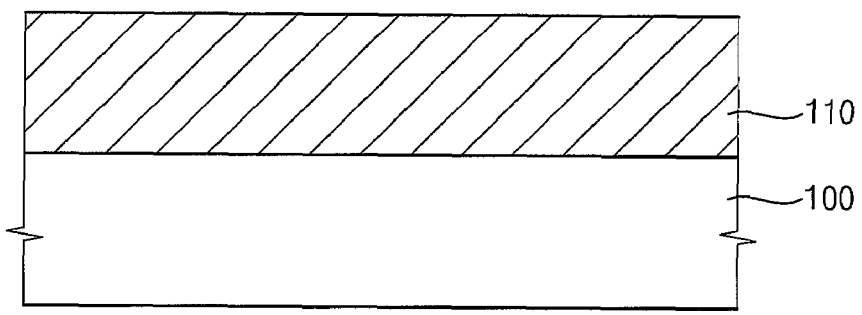
FIGS. 1 through 5 are cross-sectional views for use in describing a method of forming a pattern in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Composition for Forming a Fine Pattern

A composition that may be used in a patterning process in accordance with example embodiments of the present invention includes a water-soluble polymer, a cross-linking agent and a water-miscible solvent. The water-soluble polymer includes a repeating unit represented by Formula 1:

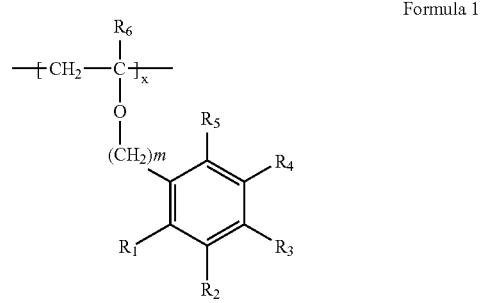

Formula 1

In Formula 1, $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ denotes a hydrogen atom or an alkyl group, m denotes an integer of 1 to 4 both inclusive, and x denotes an integer of 1 to 1,000 both inclusive. Examples of the alkyl group may include a methyl group, an ethyl group, a propyl group, a butyl group, a hexyl group or the like.

In the preceding paragraph and throughout this disclosure, "independently" is to interpreted as meaning that any two or more of $R_1$, $R_2$, $R_3$, $R_4$ and $R_5$ can be the same as each other, or that $R_1$, $R_2$, $R_3$, $R_4$ and $R_5$ can all be different from each other.

In an example embodiment of the present invention, at least one of $R_1$, $R_2$, $R_3$, $R_4$ and $R_5$ may be a hydroxyl group, a hydroxyalkyl group, an aminoalkyl group, a mercaptoalkyl group, an amino group, a mercapto group or an ammonium salt so as to ensure the solubility of the water-soluble polymer. The water-soluble polymer has an aromatic group as a side chain to enhance the etching resistance of the composition. Additionally, the aromatic group of the water-soluble polymer includes a substituent having a heteroatom so that the water-soluble polymer exhibits excellent solubility in a water-miscible solvent.

In an example embodiment of the present invention, the water-soluble polymer may include a copolymer of a first polymer having the repeating unit of Formula 1 and a second polymer including poly(vinyl alcohol), poly(vinyl acetate), poly(vinyl acetal), poly(acrylic acid) and/or poly(methacrylic acid). As one example, the water-soluble polymer may include a copolymer of the polymer represented by Formula 1, poly(vinyl alcohol) and poly(vinyl acetal). As another example, the water-soluble polymer may include a copolymer of the polymer represented by Formula 1, poly(vinyl alcohol) and poly(vinyl acetate).

In an example embodiment of the present invention, the water soluble polymer may include a repeating unit represented by Formula 2:

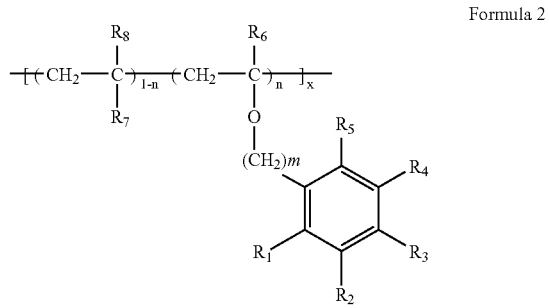

Formula 2

In Formula 2, $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ and $R_8$ independently denote a hydrogen atom or an alkyl group, $R_7$ denotes at least one selected from a hydroxyl group, an alkylcarbonyloxy group, an acetal group and a carboxylic group, m denotes an integer of 1 to 4 both inclusive, n denotes a value ranging from about 0.01 to about 0.9, and x denotes an integer of 1 to 1,000 both inclusive. Further, at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

Non-limiting examples of the alkyl group may include a methyl group, an ethyl group, a propyl group, a butyl group, a hexyl group or the like. Non-limiting examples of the alkylcarbonyloxy group may include a methylcarbonyloxy group, an ethylcarbonyloxy group, a propylcarbonyloxy group or the like. Non-limiting examples of the acetal group may include a 1-ethoxyethoxy group, 1-methoxyethoxy group, 1-ethoxypropoxy group, 1-methoxypropoxy group, 1-propoxyethoxy group or the like.

In an example embodiment of the present invention, the water-soluble polymer may include a repeating unit represented by Formula 3,

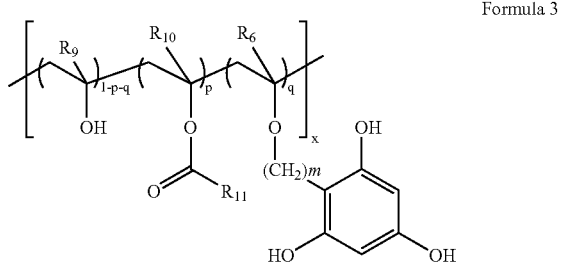

Formula 3

In Formula 3, $R_6$, $R_9$, $R_{10}$ and $R_{11}$ independently denote a hydrogen atom or an alkyl group, m denotes an integer of 1 to 4 both inclusive, p and q denote a value ranging from about 0.01 to about 0.9 and satisfy 0<p+q<1, and x denotes an integer of 1 to 1,000 both inclusive.

In an example embodiment of the present invention, the water-soluble polymer may have a weight-average molecular weight ranging from about 10,000 to about 30,000. When the weight-average molecular weight of the water-soluble polymer is less than about 10,000, the etching resistance of an interfacial layer formed using the water-soluble polymer may deteriorate. In addition, when the weight-average molecular weight of the water-soluble polymer is greater than about 30,000, the solubility of the water-soluble polymer in a water-miscible solvent may decrease, and thus a uniformity of an interfacial layer (described later) formed on a photoresist pattern may be poor.

The amount of the water-soluble polymer in the composition may preferably be in a range of about 5 to about 20% by weight. In this range, the solubility of the polymer in the composition, the viscosity of the composition, and/or a thickness of an interfacial layer may be enhanced.

The cross-linking agent included in the composition may be a water-soluble compound capable of causing a cross-linking reaction of the polymer by aid of an acid ($H^+$) or heat. For example, a urea compound, a melamine compound, a uril compound or the like may be used as the cross-linking agent. Examples of the urea compound may include urea, alkoxymethylene urea, N-alkoxymethylene urea, ethylene urea, tetrahydro-1,3,4,6-tetramethylimidazo[4,5-d]imidazole-2,5 (1H,3H)-dione or the like. Examples of the melamine compound may include alkoxymethyl melamine, alkylated melamine or the like, and examples of the uril compound may include benzoguanamine, glycoluril or the like. Examples of the cross-linking agent are not limited to these compounds, and a type of the cross-linking agent may be properly selected in accordance with a type of the water-soluble polymer and a use of the composition.

The amount of the cross-linking agent may influence a thickness of an interfacial layer formed using the composition. When the amount of the cross-linking agent is less than about 1% by weight, a cross-linking reaction between molecules of the water-soluble polymer may be insufficient. Thus, a thickness of the interfacial layer formed on a photoresist pattern too small to substantially reduce a patterning dimension of the photoresist pattern. When the amount of the cross-linking agent is greater than about 5% by weight, the thickness of the interfacial layer may not be easily adjusted. Therefore, the composition in accordance with an example embodiment of the present invention may include the cross-linking agent in a range of about 1 to about 5% by weight.

The water-miscible solvent included in the composition according to example embodiments of the present invention may not dissolve photoresist but may dissolve the water-soluble polymer and the cross-linking agent. Examples of the water-miscible solvent may include water, alcohol, a combination thereof or the like.

In an example embodiment of the present invention, the composition may include an additive such as an amine compound, a surfactant or the like. The additive may improve solubilities of the water-soluble polymer and the cross-linking agent. The amount of the additive may be properly adjusted in accordance with the solubilities of the water-soluble polymer and the cross-linking agent. For example, the amount of the additive may be in a range of about 1 to about 5% by weight with respect to the total weight of the composition.

Examples of the amine compound that may be used in the composition may include an aliphatic amine, an aromatic amine or an alcohol amine or the like. For example, the amine compound may be triethylamine, trimethylamine, tripropylamine, hexylamine, octylamine, ethylenediamine, tetramethylenediamine, diethylamine, diphenylamine, monoethanolamine, diethanolamine, a combination thereof or the like.

Examples of the surfactant that may be used in the composition may include a nonionic surfactant, a cationic surfactant, an anionic surfactant or an amphoteric surfactant, and the type of the surfactant may be properly selected considering the solubility of components in the composition.

According to example embodiments of the present invention, the compositions for forming a fine pattern include a water-soluble polymer that has an aromatic group as a side chain, and thus the compositions may exhibit enhanced etching resistance. The aromatic group of the water-soluble polymer includes a substituent having a heteroatom so that the water-soluble polymer exhibits excellent solubility in a water-miscible solvent and improved etching resistance, compared with a polymer having a heteroaromatic ring. Accordingly, the compositions may be advantageously used in forming a fine pattern having improved line edge roughness and resolution.

Method of Forming a Pattern

FIGS. 1 through 5 are cross-sectional views for reference in describing a method of forming a pattern in accordance with example embodiments of the present invention Referring to FIG. 1, a photoresist film 110 is formed on a substrate 100. For example, the substrate 100 may be a silicon wafer, a silicon-on-insulator (SOI) substrate or the like. Although not shown in the drawings, various semiconductor devices such as a gate structure, a capacitor, a metal wiring or the like may be formed on the substrate 100. Additionally, a layer (not shown) to be etched may be formed on the substrate 100 before the photoresist film 110 is formed on the substrate 100.

The photoresist film 110 may be formed on the substrate 100 by coating the substrate 100 with a photoresist composition. The photoresist composition may include a photosensitive polymer, a photoacid generator, a solvent and optionally an additive. Examples of the photosensitive polymer may include poly(meth)acrylate, polycycloolefin, a copolymer of cycloolefin-maleic anhydride (COMA), a copolymer of vinyl ether-maleic anhydride (VEMA), a copolymer of cycloolefin and ring-opened maleic anhydride (ROMA), or the like. However, these are merely examples and other photosensitive polymers may be used.

The photoacid generator included in the photoresist composition may react to light to thereby generate an acid or a hydrogen ion ($H^+$). The acid generated from the photoacid generator may detach an acid-labile group from the photosensitive polymer to change the solubility of the photosensitive polymer in a developing solution. Additionally, the acid may diffuse into a water-soluble coating layer 130 formed on a photoresist pattern 120 (see FIG. 3) to cause a cross-linking reaction of a cross-linking agent and a water-soluble polymer in the water-soluble coating layer 130. Examples of the photoacid generator may include a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, a sulfonate, trichloromethyl triazine, N-hydroxysuccinimide triflate or combinations thereof. However, these are merely examples and other compounds may be used.

Figure 2:
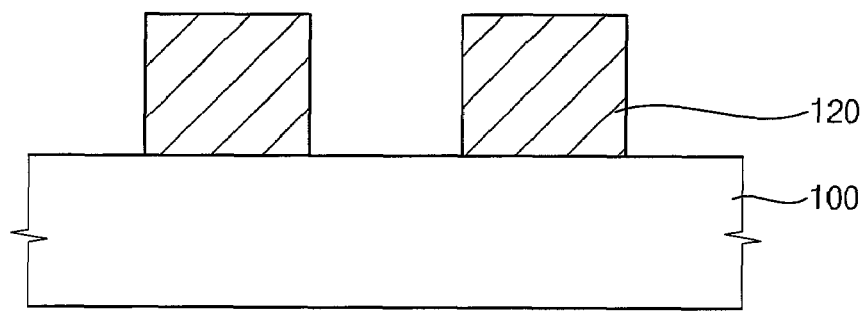

Referring to FIG. 2, an exposure process and a developing process are performed on the photoresist film 100 to form a photoresist pattern 120 on the substrate 100. The photoresist pattern 120 may have one of various shapes such as a linear shape, a rounded shape, a tube shape or the like. An acid ($H^+$) that is generated from the photoacid generator during the exposure process may remain in the photoresist pattern 120.

Figure 3:
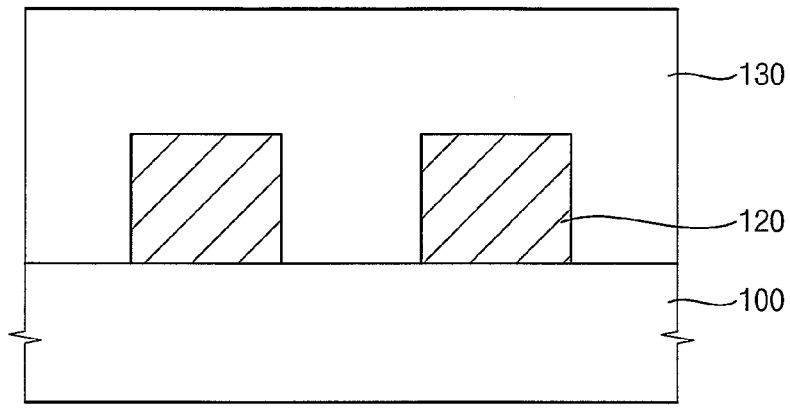

Referring to FIG. 3, a water-soluble coating layer 130 is formed on the substrate 100 to cover the photoresist pattern 120. The water-soluble coating layer 130 is formed by coating the substrate 100 having the photoresist pattern 120 with a composition in accordance with example embodiments of the present invention. The composition includes a water-soluble polymer, a cross-linking agent and a water-miscible solvent. The water-soluble polymer includes a repeating unit as represented by Formula 1:

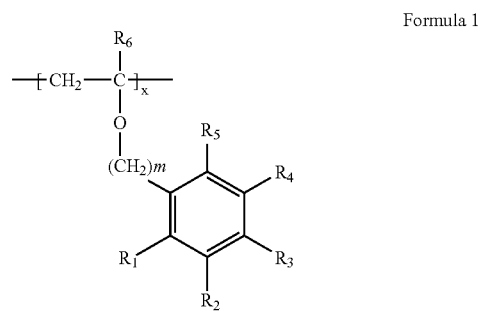

Formula 1

In Formula 1, $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ denotes a hydrogen atom or an alkyl group, m denotes an integer of 1 to 4 both inclusive, and x denotes an integer of 1 to 1,000 both inclusive. Also, at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

Figure 4:
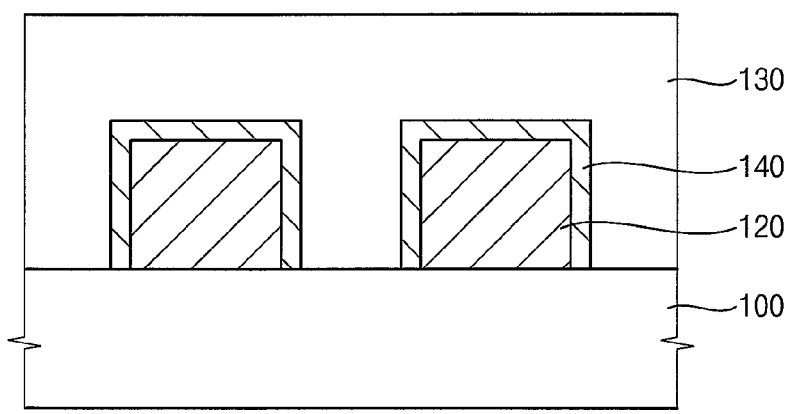

Referring to FIG. 4, a baking process is performed on the substrate having the water-soluble coating layer 130 to thereby form an interfacial layer 140 on the photoresist pattern 120. The interfacial layer 140 may be formed by a cross-linking reaction between the water-soluble polymer and the cross-linking agent, which is activated by an acid ($H^+$) diffused from the photoresist pattern 120 and heat from the baking process. The cross-linking reaction may mainly occur at an interface between the photoresist pattern 120 and the water-soluble coating layer 130, since the acid diffused from the photoresist pattern 120 to the water-soluble coating layer 130 may be exhausted at an interface between the photoresist pattern 120 and the water-soluble coating layer 130. Therefore, the interfacial layer 140 is formed at an interface between the photoresist pattern 120 and the water-soluble coating layer 130.

The baking process for forming the interfacial layer 140 may be carried out by selecting a temperature and a bake time appropriate for causing the cross-linking reaction. For example, the baking process may be performed at a temperature of about 90 to about 150° C.

Figure 5:
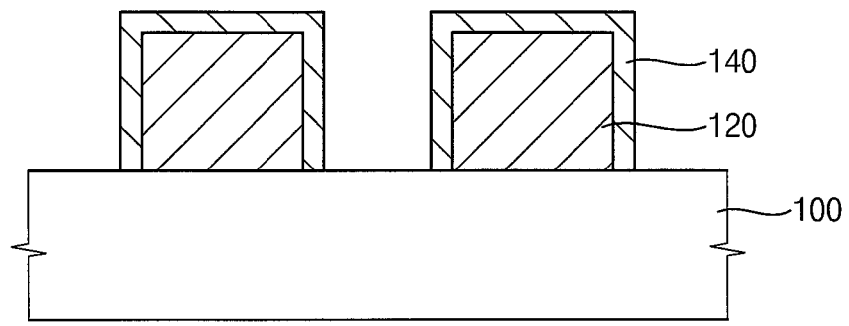

Referring to FIG. 5, the water-soluble coating layer 130 remaining on the interfacial layer 140 is removed from the substrate 100 by a developing process. For example, the developing process may be carried out using a developing solution such as water, alcohol or a combination thereof.

In an example embodiment of the present invention, when the layer to be etched is formed below the photoresist film 110, the layer may be etched by an etching process using the interfacial layer 140 and the photoresist pattern 120 as etching masks. As a result, a pattern may be formed on the substrate 100.

In the etching process, the interfacial layer 140 formed using the composition according to example embodiments of the present invention may exhibit enhanced etching resistance. The water-soluble polymer included in the interfacial layer 140 has an aromatic group as a side chain, and thus the interfacial layer 140 may exhibit enhanced etching resistance in comparison with an interfacial layer including a polymer that has an aliphatic side chain. The aromatic group of the water-soluble polymer includes a substituent having a heteroatom so that the interfacial layer including the water-soluble polymer exhibits improved etching resistance, compared with a polymer having a heteroaromatic ring. Additionally, a fine pattern exceeding an exposure limit of a light source used in an exposure apparatus may be formed by employing both the interfacial layer 140 and the photoresist film 120 as etching masks. Accordingly, in a semiconductor manufacturing process, a fine pattern having improved line edge roughness and resolution may be formed.

Hereinafter, example embodiments of the present invention are described more fully with reference to preparation examples of the composition and evaluations of the composition. However, the present invention is not limited to these specific examples, and instead various changes and modifications can be made by one ordinary skilled in the art within the spirit and scope of the present invention.

Synthesis of a Water-Soluble Polymer

SYNTHETIC EXAMPLE 1

A water-soluble polymer that may be used in preparation of the composition was synthesized in accordance with the following Reaction Formula 1.

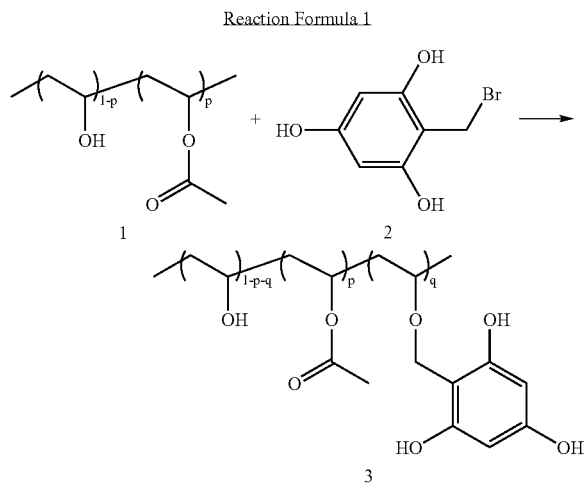

In particular, the water-soluble polymer (3) was synthesized by reacting a copolymer of vinyl alcohol and vinyl acetate (1) with 2-(bromomethyl) benzene-1,3,5-triol (2). The weight-average molecular weight of the water-soluble polymer thus obtained was about 15,000, p was about 0.15, and q was about 0.1.

The structure of the water-soluble polymer was verified using spectrums of proton nuclear magnetic resonance ($^1$H-NMR) and carbon nuclear magnetic resonance ($^{13}$C-NMR). The $^1$H-NMR spectrum showed chemical shifts ($\delta$) at 5.69 ppm (2H, s, aryl-H), 5.0 ppm (3H, s, aryl-OH) and 5.24 ppm (2H, s, CH$_2$). The $^{13}$C-NMR spectrum showed chemical shifts ($\delta$) at 160.4 ppm, 157.4 ppm, 157 ppm, 110 ppm, 96.1 ppm, 96.0 ppm and 56.8 ppm.

Preparation of Compositions

EXAMPLE 1

A composition for use in the formation of a fine pattern was prepared by mixing about 10% by weight of the water-soluble polymer obtained in Synthetic Example 1, about 3% by weight of ethoxymethylene urea as a cross-linking agent, about 3% by weight of triethylamine, and a remainder of water.

COMPARATIVE EXAMPLE 1

A composition was prepared by mixing about 10% by weight of the water-soluble polymer represented by Formula 4, about 3% by weight of ethoxymethylene urea as a cross-linking agent, about 3% by weight of triethylamine and a remainder of water. In Formula 4, p was about 0.15 and q was about 0.1. The weight-average molecular weight of the water-soluble polymer was about 15,000.

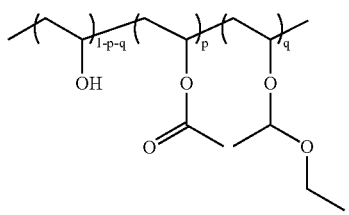

Formula 4

Evaluation of Etching Resistance of an Interfacial Layer

The etching resistance of interfacial layers formed using the compositions prepared in Example 1 and Comparative Example 1 was evaluated.

After a silicon oxide layer having a thickness of about 2,000 Å was formed on a silicon wafer, a photoresist film having a thickness of about 4,000 Å was formed on the silicon oxide layer. The photoresist film was formed using a photoresist composition, which included about 7% by weight of a methacrylate resin, about 1.5% by weight of triphenylsulfonium triflate, about 1% by weight of an amine-based additive, and a remainder of propylene glycol methyl ether. A photolithography process was performed on the photoresist film to form a photoresist pattern on the silicon oxide layer. A distance between patterns of the photoresist pattern was about 140 nm.

Two silicon wafers, on which the photoresist pattern was formed, were coated with the compositions prepared in Example 1 and Comparative Example 1, respectively. As a result, a water-soluble coating layer having a thickness of about 1,500 Å was formed on the silicon wafer to cover the photoresist pattern. The silicon wafer having the water-soluble coating layer was baked at a temperature of about 100° C. to about 110° C. to form an interfacial layer on the photoresist pattern. The water-soluble coating layer remaining on the interfacial layer was removed from the silicon wafer using de-ionized water. A distance between patterns on which the interfacial layer was formed was about 75 nm. The silicon oxide layer was etched using the interfacial layer and the photoresist pattern as etching masks to form a silicon oxide layer pattern on the silicon wafer.

Figure 6:
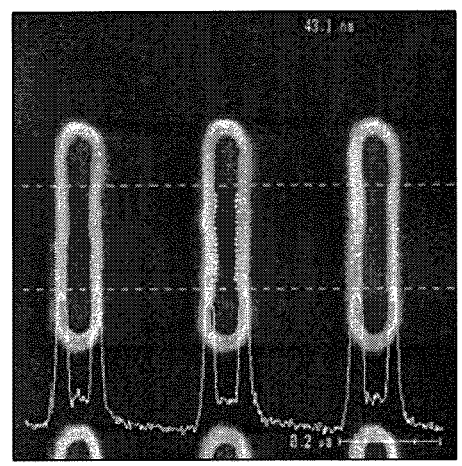
FIG. 6 is a scanning electron microscopic (SEM) picture showing a pattern formed using the composition prepared in an Example 1.
Figure 7:
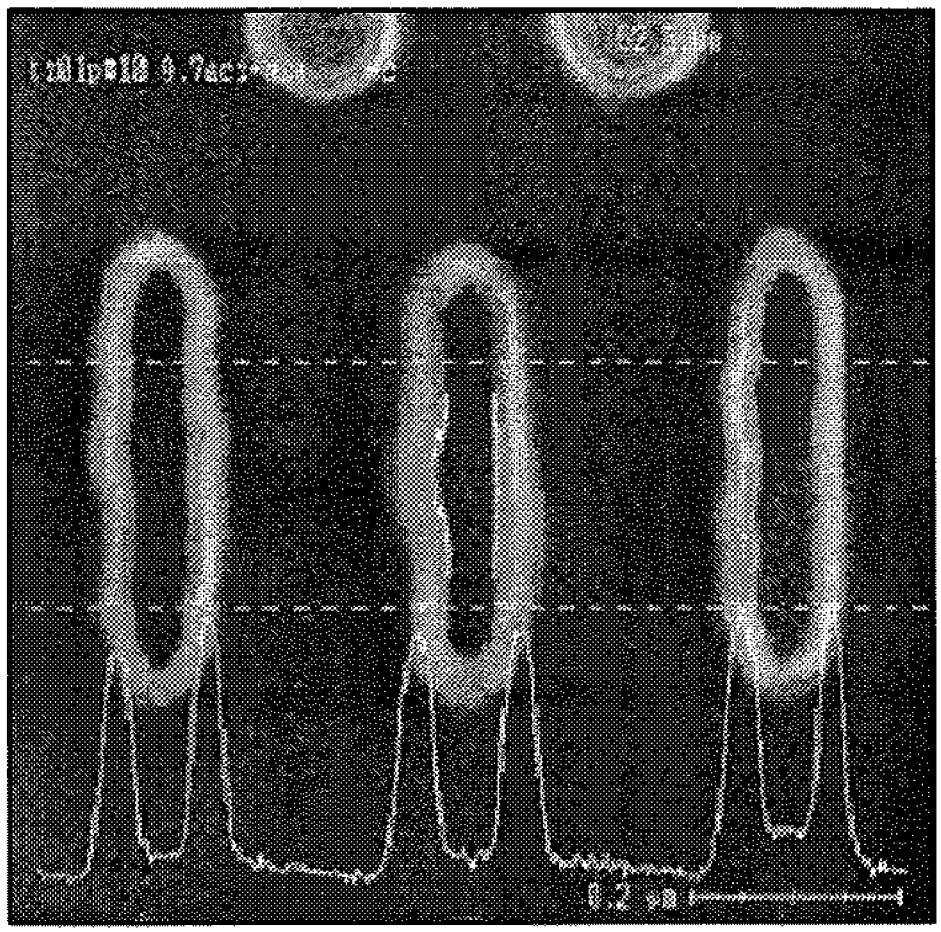
FIG. 7 is an SEM picture showing a pattern formed using the composition prepared in a Comparative Example 1.

FIG. 6 is an SEM picture illustrating the silicon oxide layer pattern obtained using the composition prepared in Example 1, and FIG. 7 is an SEM picture illustrating the silicon oxide layer pattern obtained using the composition prepared in Comparative Example 1.

As shown in FIG. 7, the silicon oxide layer pattern formed using the composition of Comparative Example 1 had a relatively unclear shape and a relatively high line edge roughness. On the other hand, as shown in FIG. 6, the silicon oxide layer pattern formed using the composition of Example 1 had a relatively clear shape and substantially reduced line edge roughness. Accordingly, it may be noted that the interfacial layer formed using the composition of the present invention exhibits enhanced etching resistance, and thus the interfacial layer may improve both the shape of a pattern and the line edge roughness.

A distance between patterns of the silicon oxide layer pattern was measured. The distances between patterns of the silicon oxide layer pattern obtained using the compositions of Example 1 and Comparative Example 1 were about 50 nm and about 55 nm, respectively. The interfacial layer formed using Comparative Example 1 was damaged while the silicon oxide layer was being etched so that the distance between patterns of the silicon oxide layer pattern was substantially larger than that of the silicon oxide layer pattern obtained using the composition of Example 1. Therefore, it may again be noted that the composition in accordance with example embodiments of the present invention exhibits relatively high etching resistance.

According to example embodiments of the present invention, the compositions for forming a fine pattern include a water-soluble polymer that has an aromatic group as a side chain, and thus the compositions may exhibit enhanced etching resistance. The aromatic group of the water-soluble polymer includes a substituent having a heteroatom so that the water-soluble polymer exhibits excellent solubility in a water-miscible solvent and improved etching resistance, compared with a polymer having a heteroaromatic ring. Additionally, a fine pattern exceeding an exposure limit of a light source may be formed by using both an interfacial layer and a photoresist film as etching masks. Accordingly, in a semiconductor manufacturing process, a fine pattern having improved line edge roughness and resolution may be formed.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A composition for forming a fine pattern, comprising a water-soluble polymer, a cross-linking agent, and a water-miscible solvent, wherein the water-soluble polymer includes a repeating unit represented by Formula 1,

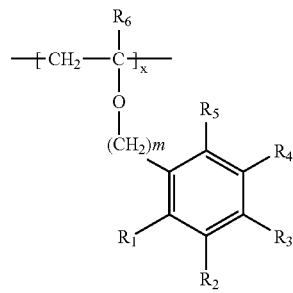

Formula 1 wherein $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ denotes a hydrogen atom or an alkyl group, m denotes an integer of 1 to 4 both inclusive, and x denotes an integer of 1 to 1,000 both inclusive, and wherein at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

2. The composition of claim 1, wherein the water-soluble polymer includes a repeating unit represented by Formula 2,

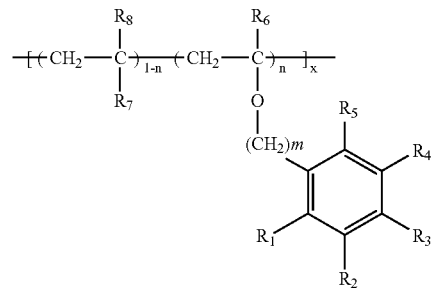

Formula 2 wherein $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ and $R_8$ independently denote a hydrogen atom or an alkyl group, $R_7$ denotes at least one selected from a hydroxyl group, an alkylcarbonyloxy group, an acetal group and a carboxylic group, m denotes an integer of 1 to 4 both inclusive, n denotes a value ranging from about 0.01 to about 0.9, and x denotes an integer of 1 to 1,000 both inclusive, and wherein at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

3. The composition of claim 1, wherein the water-soluble polymer comprises a copolymer of a polymer having the repeating unit represented by Formula 1, and at least one polymer selected from the group consisting of poly(vinyl alcohol), poly(vinyl acetate), poly(vinyl acetal), poly(acrylic acid) and poly(methacrylic acid).

4. The composition of claim 1, wherein the water-soluble polymer has a weight-average molecular weight of about 10,000 to about 30,000.

5. The composition of claim 1, wherein the cross-liking agent comprises a urea compound, a melamine compound or a combination thereof.

6. The composition of claim 1, wherein the composition comprises about 5 to about 20% by weight of the water-soluble polymer, and about 1 to about 5% by weight of the cross-linking agent.

7. The composition of claim 1, wherein the composition further comprises an additive.

8. The composition of claim 7, wherein the additive includes at least one of an amine compound and a surfactant.

9. The composition of claim 7, wherein the composition comprises about 5 to about 20% by weight of the water-soluble polymer, about 1 to about 5% by weight of the cross-linking agent, about 1 to about 5% by weight of the additive, and a remainder of the water-miscible solvent.

10. The composition of claim 1, wherein the water-soluble polymer includes a repeating unit represented by Formula 3, Formula 3

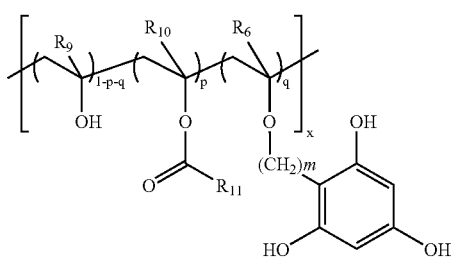

wherein $R_6$, $R_9$, $R_{10}$ and $R_{11}$ independently denote a hydrogen atom or an alkyl group, m denotes an integer of 1 to 4 both inclusive, p and q denote a value ranging from about 0.01 to about 0.9 and satisfy 0<p+q<1, and x denotes an integer of 1 to 1,000 both inclusive.

11. A method of forming a pattern on a substrate, comprising:

forming a photoresist pattern on the substrate;

forming a water-soluble coating layer on the photoresist pattern by coating the substrate with a composition including a water-soluble polymer, a cross-linking agent and a water-miscible solvent; and performing a baking process on the substrate to form an interfacial layer on the photoresist pattern;

wherein the water-soluble polymer includes a repeating unit represented by Formula 1, Formula 1

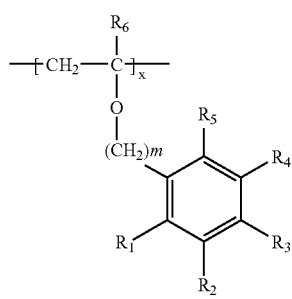

wherein $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ denotes a hydrogen atom or an alkyl group, m denotes an integer of 1 to 4 both inclusive, and x denotes an integer of 1 to 1,000 both inclusive, and wherein at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

12. The method of claim 11, further comprising:

forming a layer to be etched on the substrate before forming the photoresist pattern on the substrate; and etching the layer to be etched by using the interfacial layer and the photoresist pattern as etching masks.

13. The method of claim 12, further comprising removing the water-soluble coating layer prior to etching.

14. The method of claim 13, wherein the water-soluble coating layer is removed using a solution comprising at least one of water and alcohol.

15. The method of claim 11, wherein the baking process is performed at a temperature of about 90 to about 150° C.

16. The method of claim 11, wherein the water-soluble polymer includes a repeating unit represented by Formula 2, Formula 2

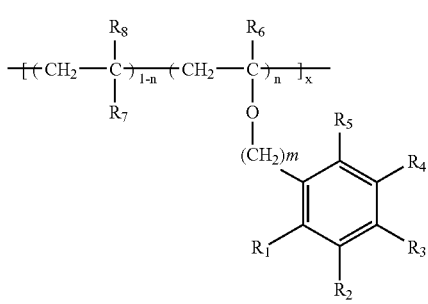

wherein $R_1$, $R_2$, $R_3$, $R_4$ and $R_5$ independently denote a hydrogen atom, a hydroxyl group, an alkyl group, a hydroxyalkyl group, an aminoalkyl group, a mercaptoalkyl group, an amino group, a mercapto group or an ammonium salt, $R_6$ and $R_8$ independently denote a hydrogen atom or an alkyl group, $R_7$ denotes at least one selected from a hydroxyl group, an alkylcarbonyloxy group, an acetal group and a carboxylic group, m denotes an integer of 1 to 4 both inclusive, n denotes a value ranging from about 0.01 to about 0.9, and x denotes an integer of 1 to 1,000 both inclusive, and wherein at least one of $R_1$, $R_2$, $R_3$, $R_4$ and $R_5$ is a hydroxyl group, a hydroxyalkyl group, an aminoalkyl group, a mercaptoalkyl group, an amino group, a mercapto group or an ammonium salt.

17. The method of claim 11, wherein the water-soluble polymer includes a repeating unit represented by Formula 3, Formula 3

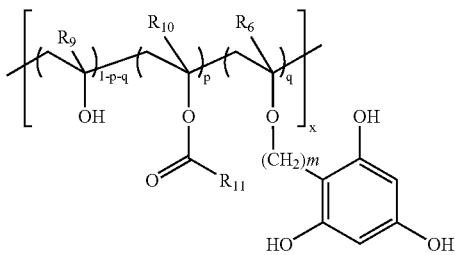

wherein $R_6$, $R_9$, $R_{10}$ and $R_{11}$ independently denote a hydrogen atom or an alkyl group, m denotes an integer of 1 to 4 both inclusive, p and q denote a value ranging from about 0.01 to about 0.9 and satisfy 0<p+q<1, and x denotes an integer of 1 to 1,000 both inclusive.

* * * * *